United States Patent
Osipov et al.

(10) Patent No.: US 6,774,446 B2
(45) Date of Patent: Aug. 10, 2004

(54) EFFICIENT SPIN-INJECTION INTO SEMICONDUCTORS

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/284,183

(22) Filed: Oct. 31, 2002

(65) Prior Publication Data

US 2004/0084739 A1 May 6, 2004

(51) Int. Cl.[7] .......................... H01L 29/76; H01L 29/06; G11C 11/34
(52) U.S. Cl. .......................... 257/421; 257/75; 365/158; 365/171
(58) Field of Search .......................... 257/75, 295, 421; 365/158, 171, 175

(56) References Cited

PUBLICATIONS

H. J. Zhu et al., Phys. Rev. Lett. 87, 016601 (2001).*

Albrecht et al., cond–mat/0110059, (Feb. 7, 2002) (a publication of ArXiv.org, available at http://arXiv.org/PS_cache/cond–mat/pdf/0202/0202131.pdf. arXiv.org is owned, operated and funded by Cornell University).*

* cited by examiner

*Primary Examiner*—Minhloan Tran
*Assistant Examiner*—Thomas L Dickey

(57) ABSTRACT

An efficient spin injection into semiconductors. Previous spin injection devices suffered from very low efficiency (less than 2% at room temperature) into semiconductors. A spin injection device with a δ-doped layer placed between a ferromagnetic layer and a semiconductor allows for very high efficient (close to 100%) spin injection to be achieved at room temperature.

27 Claims, 6 Drawing Sheets

EFFICIENT SPIN-INJECTION INTO SEMICONDUCTORS

RELATED APPLICATIONS

The following application of the common assignee, which is hereby incorporated by reference in its entirety, may contain some common disclosure and may relate to the present invention:

U.S. patent application Ser. No. 10/284,360, entitled "MAGNETIC SENSOR BASED ON EFFICIENT SPIN INJECTION INTO SEMICONDUCTORS".

FIELD OF THE INVENTION

This invention relates generally to spintronics. In particular, the invention relates generally to efficient room temperature spin injection into semiconductors.

BACKGROUND OF THE INVENTION

Over the past decade a pursuit of solid state ultrafast scaleable devices based on both the charge and spin of an electron has led to a development of new fields of magnetoelectronics and spintronics. The discovery of giant magnetoresistance (GMR) in magnetic multilayers has quickly led to important applications in storage technology. GMR is a phemonenon where a relatively small change in magnetism results in a large change in the resistance of the material.

The phenomenon of a large tunnel magnetoresistance (TMR) of ferromagnet-insulator-ferromagnet structures is a focus of product development teams in many leading companies. TMR is typically observed in F1-I-F2 structures made of two ferromagnetic layers, F1 and F2, of similar or different materials separated by the insulating thin tunnel barrier I with thickness typically ranging between 1.4–2 nm. The tunnel current through the structure may differ significantly depending on whether the magnetic moments are parallel (low resistance) or anti parallel (high resistance). For example, in ferromagnets such as $Ni_{80}Fe_{20}$, Co—Fe, and the like, resistance may differ by up to 50% at room temperature for parallel (low resistance) versus antiparallel (high resistance) moments on ferromagnetic electrodes.

It is worth mentioning recent studies of the giant ballistic magnetoresistance of Ni nanocontacts. Ballistic magnetoresistance is observed in Ni and some other nanowires where the typical cross-section the nano-contacts of the nanowire is a few square nanometers. The transport in this case is through very short constriction and it is believed to be with conservation of electron momentum (ballistic transport). The change in the contact resistance can exceed 10 fold (or over 1000%).

Of particular interest has been the injection of spin-polarized carriers, which are currents mainly in the form of spin-polarized electrons into semiconductors. This is largely due to relatively large spin-coherence lifetimes of electrons in semiconductors, possibilities for use in ultra fast devices, use in quantum communication and computation and the like. The possibility of spin injection from ferromagnetic semiconductors (FMS) into nonmagnetic semiconductors has been demonstrated in a number of recent publications. However, the Curie temperature (the temperature above which a material becomes non-magnetic) of magnetic semiconductors is substantially below room temperature. The low Curie temperature limits possible applications. Room-temperature spin injection from ferromagnets (FM) into semiconductors also has been demonstrated, but it remains a difficult task and the efficiency is very low.

The main problem of the spin injection from a ferromagnet into a semiconductor is that a potential barrier (Schottky barrier) always arises in the semiconductor near the metal-semiconductor interface. Numerous experiments show that the barrier height $\Delta$ is determined by surface states forming on the interface, and is approximately ( ) $E_g$ practically independently of type of the metal, where $E_g$ is the energy band gap of the semiconductor, i.e. the difference between the conduction band energy level $E_C$ and the valence band energy level $E_V$. For example, barrier height $\Delta$ is about 0.8–1.0 eV for GaAs and about 0.6–0.8 eV for Si.

FIG. 1A illustrates a schematic of a conventional spin-injection device 100. As shown, the spin-injection device 100 includes a semiconductor 110 and a ferromagnetic (FM) layer 120 above the semiconductor 110. The device 100 also includes electrodes 130 and 140 connecting to the ferromagnetic layer 120 and the semiconductor 110. As will be shown below, the Schottky barrier formed in such a device is very wide, which makes tunneling of electrons practically impossible.

FIG. 1B illustrates an energy band diagram of the conventional spin-injection device 100 illustrated in FIG. 1A. The barrier for electrons has a height $\Delta$ and width l (which is the width of the Schottky depletion layer). The electrons with energy E should tunnel a distance $x_0$ of the barrier. As noted above, the height $\Delta \approx \frac{2}{3} E_g$, practically independently of type of the metal.

The amount of spin injection is determined by current in the reverse direction through the Schottky barrier. This current is usually extremely small mainly due to the relatively large barrier width l (e.g. width l>40 nm in not too heavily doped semiconductors with $N_s \leq 10^{18}$ cm$^{-3}$, where $N_s$ is the donor concentration level of the semiconductor) and the barrier height $\Delta$, which is much greater than $k_B T$, where $k_B$ is the Boltzmann constant and T is the device temperature. The current through the structure is determined by electron thermionic emission, which is extremely small (because the barrier is high compared to the temperature, $\Delta \gg k_B T$). Therefore, the effective spin injection in the conventional device 100 is impossible for all practical purposes.

SUMMARY OF THE INVENTION

According to an embodiment of the present inventions, a spin-injection device comprises a ferromagnetic layer, a semiconductor, and an extremely thin and extremely heavily doped layer, $\delta$-doped layer, between the ferromagnetic layer and the semiconductor.

BRIF DESCRIPTION OF THE DRAWINGS

Features of the present invention will become known from the following description with reference to the drawings, in which.

DETAILED DESCRIPTION

For simplicity and illustrative purposes, the principles of the present invention are described by referring mainly to exemplary embodiments thereof. In the following description, numerous specific details are set forth in order to provide a thorough understanding of the present invention. However, the present invention may be practiced without limitation to these specific details. In other instances, well known methods and structure have not been described in detail so as not to unnecessarily obscure the present invention.

Figure 2A:
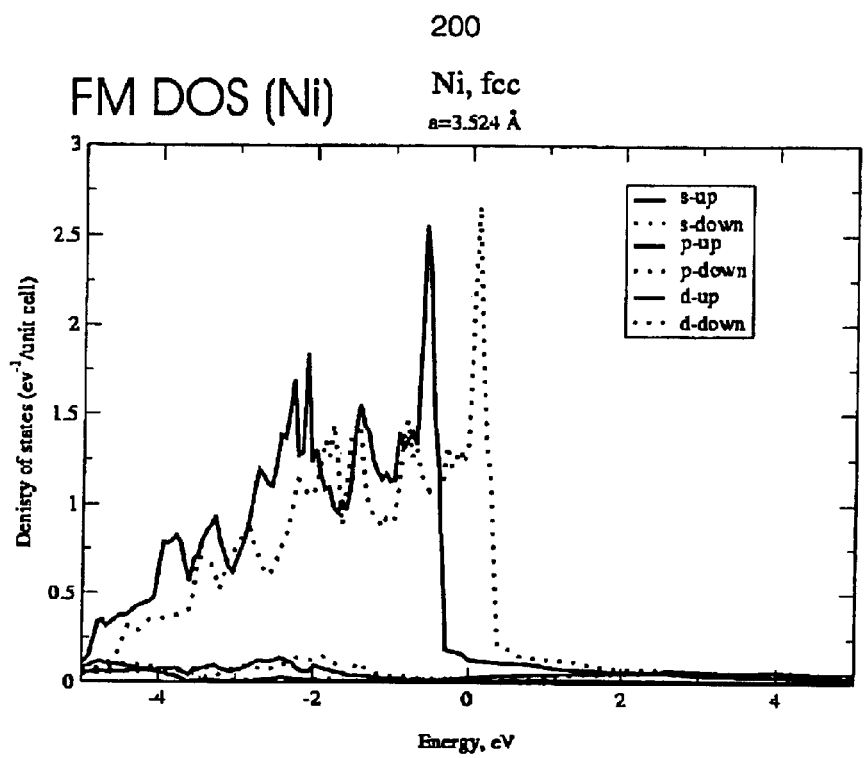
FIG. 2A illustrates a density of electronic states (DOS) of ferromagnetic Ni.

Electrons in magnetic materials, such as ferromagnetic Ni, Co, and Fe metals, may be described by a density of electronic states ("DOS"). DOS is a measure of the number of electrons per unit volume in a particular energy interval (E,E+dE) (also referred to as g(E)dE). FIG. 2A illustrates the density of electronic states (DOS) of ferromagnetic Ni, where arrows indicate the DOS for majority (spin up) and minority (spin down) electrons. Note that the d-electrons have the highest peak for both spin-up and spin-down.

Figure 2B:
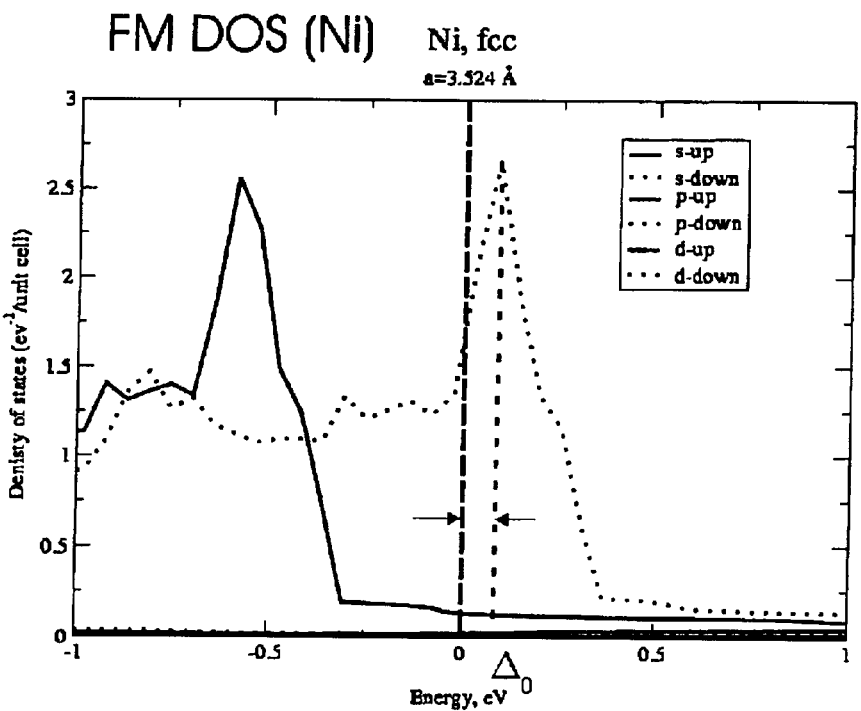
FIG. 2B illustrates the density of electronic states (DOS) of ferromagnetic Ni, but at a higher resolution than in FIG. 2A.

FIG. 2B illustrates the density of electronic states (DOS) of ferromagnetic Ni, but at a higher resolution than in FIG. 2A. The energy origin is chosen at $E=E_F=0$. As shown, there is a very large difference in the density of states of minority and majority d-electrons at E>0 (states above the Fermi level). The peak in the DOS of minority states is positioned at $E=\Delta_0$, which for Ni, $\Delta_0 \approx 0.1$ eV. Similar regions at E>0 exist in the DOSs of Co and Fe metals. If electrons are injected from the ferromagnetic material with energies E≈0, the electrons would be almost 100% polarized. This idea is realized in an embodiment.

Note that the DOS for s and p electrons are negligible when compared to the d-electrons, especially near $E=\Delta_0$.

Figure 3A:
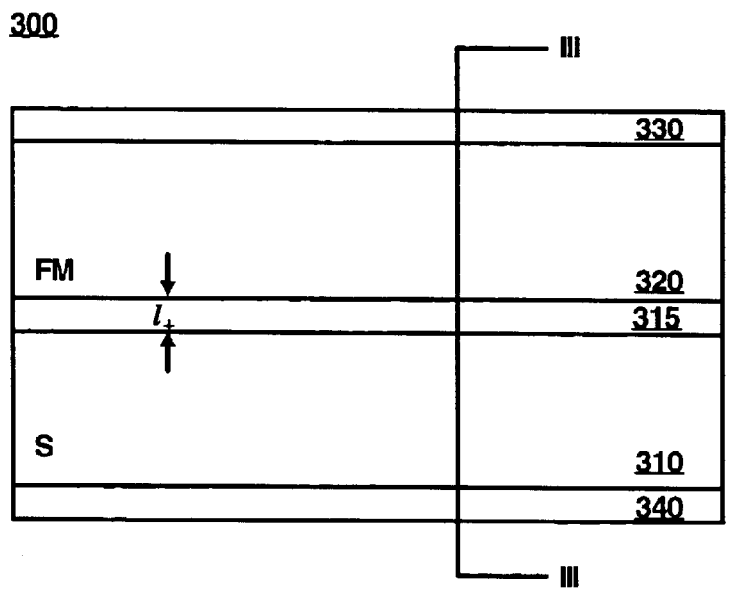
FIG. 3A illustrates a spin-injection device according to an embodiment of the present invention.

FIG. 3A illustrates a spin-injection device 300 according to an embodiment of the present invention. As will be discussed below, the device 300 may be used as a room temperature spin-emitter because its efficiency can be high. As shown, the spin-injection device 300 may include a semiconductor 310 and a ferromagnetic layer 320 above the semiconductor 310. The device may include a δ-doped layer 315 placed between the semiconductor 310 and the ferromagnetic layer 320. The device 300 may also include electrodes 330 and 340 electrically connected to the ferromagnetic layer 320 and the semiconductor 310, respectively.

The ferromagnetic layer 320 may be formed from various magnetic materials, preferably Ni, Fe or Co, as well as various magnetic alloys, which may include one or a combination of Fe, Co, and Ni. The semiconductor 310 may be formed from various materials including Si, GaAs, ZnTe, GaSb, GaP, Ge, InAs, CdSe, InP, InSb, CdTe, CdS, ZnS, ZnSe, AlP, AlAs, AlSb and also alloys of these materials. In general, it is preferred that the semiconductor 310 be formed from materials with relatively large electron spin relaxation time, for example GaAs, ZnSe and ZnCdSe. The semiconductor 310 may be negatively doped.

The δ-doped layer 315, used to make the barrier transparent for tunneling electrons with energies $E \geq \Delta_0$, may be formed by heavily doping of a portion of the semiconductor 310. For example, the semiconductor 310 may be an n-type semiconductor and the δ-doped layer 315 may be formed by heavily doping with electron rich materials. Examples of such electron rich materials include P, As, and Sb, which are typically used to dope Ge and Si, and Ge, Se, Te, Si, Pb and Sn, which are typically used to dope GaAs.

The spin-injection device 300 thus formed may be described as having a FM-n$^+$-n structure with parameters adjusted to sufficiently meet the conditions listed below.

Figure 3B:
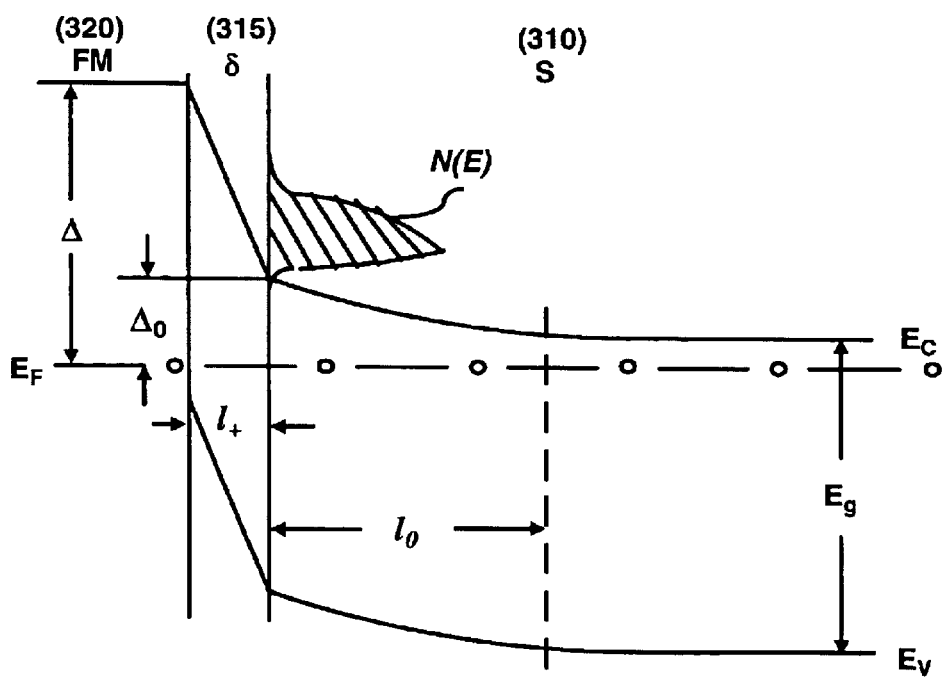
FIG. 3B illustrates an exemplary energy diagram of spin-injection device shown in FIG. 3A along the line II—II.

FIG. 3B illustrates an exemplary energy diagram of spin-injection device 300 along the line III—III of FIG. 3A. For efficient spin-injection to take place, the donor concentration $N_d$ of the δ-doped layer 315 should be sufficiently high, the thickness $l_+$ of the same should be sufficiently small, and the barrier at height $\Delta_0$ (see FIG. 3B) of the semiconductor 310 should be sufficiently wide.

When the donor concentration $N_d$ is sufficiently high and the thickness $l_+$ is sufficiently small, the δ-doped layer 315 is "transparent" for tunneling electrons. In other words, the electrons may traverse the δ-doped layer 315 rather easily. Because of the heavy doping, the drop of the Schottky barrier towards the semiconductor is very abrupt, and this makes it transparent to electrons with $E \approx \Delta_0$.

It is important that the tunneling of the electrons with lower energies is prevented by lower and much wider barrier with the width $l_0$ in the semiconductor 310. As indicated in FIG. 3B, the energy spectrum N(E) of the emitted electrons has a sharp peak at $E \approx \Delta_0$. Thus, only those "hot" electrons with the energy $E \approx \Delta_0$ would effectively tunnel through the structure, when the parameters of the device obey the conditions indicated below. Note that the number of the electrons with $E > \Delta_0 + k_B T$ decreases exponentially with energy. Therefore, the width peak of the emitted electrons is several $k_B T$.

The barrier height $\Delta_0$ and width $l_0$ of the semiconductor 310 may be tuned to desirable values. For example, these parameters may be tuned to correspond to the peak in minority spin DOS. In this way, it is possible to achieve an effective mechanism of spin-injection based on the process of thermionic emission of highly polarized electrons with the energy near $E \approx \Delta_0$ from the ferromagnetic layer 320 into the semiconductor 310 through the δ-doped layer 315 between the ferromagnet-semiconductor (FM-S) interface.

Figure 3C:
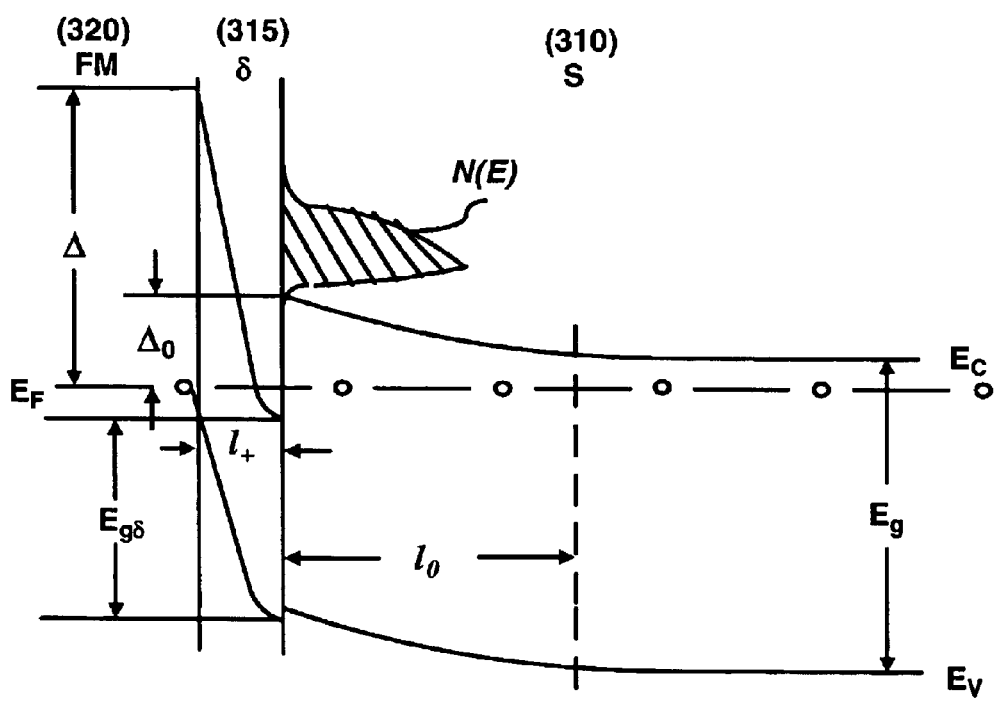
FIG. 3C illustrates an exemplary energy diagram of spin-injection device shown in FIG. 3A along the line III—III, wherein the δ-doped layer has a narrower energy band gap than that of the semiconductor.

Alternatively, the δ-doped layer 315 may be formed by growing a n$^+$ doped layer above the n-doped semiconductor 310. It is preferred that the δ-doped layer 315 be doped heavily as practicable and be as thin as practicable. The spin-injection device 300 thus formed may be described as having a heterostructure FM-n$^+$-n structure. Preferably, the δ-doped layer 315 of the heterostructure FM-n$^+$-n structure has a narrower energy band gap $E_g^\delta$ than the energy band gap $E_g$ of the semiconductor 310, i.e. $E_g^\delta < E_g$, and at that an electron affinity for the semiconductor 310 may be less by a value close to $\Delta_0$ of an electron affinity of the δ-doped layer 315. This is shown in FIG. 3C, which illustrates an exemplary energy diagram of spin-injection device 300 shown in FIG. 3A along the line III—III.

The structure shown in FIG. 3A allows for an effective mechanism of spin-injection by using the process of thermionic emission of highly polarized hot electrons from the ferromagnetic layer 320 into the semiconductor 310 through the δ-doped layer 315. To calculate the spin-injection, a prevalent assumption is made that the four electron subsystems may be considered as being independent in ferromagnets: two types of d-electrons with spin up d↑ and down d↓ and two types of s-electrons with spin up s↑ and down s↓. In other words, the p-electrons and the spin-orbit interaction between these four electron subsystems are neglected. Then the total current J flowing from a ferromagnet into a semiconductor through the barrier can be written as follows:

$$J = \sum_i J_i = \frac{q}{h}\sum_i \int dE[f(E) - f(E+qV)g_i(E)g_i(E+qV)D_i(E) \quad (1)$$

where the indices i refers to d↑, d↓, s↑, and s↓ electrons described above (also may be referred as i-electrons); q and E are electron charge and energy in every layer since the energy E is conserved during tunneling (elastic tunneling); $f(E)=[\exp\{(E-E_F)/k_BT\}+1]^{-1}$ is the Fermi-Dirac distribution function wherein $E_F$ is the Fermi level of the ferromagnetic layer 320, T is the temperature (temperature T is assumed to be the same in all parts of the device), and $k_B$ is the Boltzmann constant; V is the applied bias voltage; $g_i(E)$ is the density of states (DOS) of electrons for each i-electron; and $D_i$ is a transmission coefficient of the interface barrier for each i-electron.

The tunnel transparency D may be estimated in a semi-classical (WKB) approximation as follows:

$$D \approx \exp\left(-\frac{4}{3}\sqrt{\frac{\Delta-E}{I}}\right) \quad (2)$$

where $I=\hbar^2/(2m^*x_0^2)$ is the characteristic energy scale for the tunnel barrier; ℏ is Planck's constant; $x_0$ is the distance electrons with the given energy E tunnel under the barrier; and m* is the effective mass of tunneling electron. Typically, the energy origin is chosen at $E=E_F=0$.

Without the δ-doped layer 315, as discussed previously, a Schottky potential barrier arises in the semiconductor near the FM-S interface. This barrier is characterized by height Δ and width l as shown in FIG. 1B. The value l is the width of the (Schottky) depletion layer in the semiconductor 310 and is represented by the following equation:

$$l = \sqrt{\frac{2\varepsilon_0\varepsilon\Delta}{q^2 N_s}} \quad (3)$$

wherein $\varepsilon_O$ is the permittivity of free space, ε is the relative permittivity of the semiconductor 110, q>0 is the elementary charge, and $N_s$ is the concentration donors in the semiconductor 110.

According to Equation (3), for a conventional semiconductor (Δ 0.6 eV) that is relatively low doped ($N_s \leq 10^{18}$ cm$^{-3}$), the barrier width $l_0$ is typically greater than 40 nm. It follows from Equation (2) that for $x_0 \leq l > 40$ nm and Δ 0.6 eV, the tunneling of the electrons with energies close to $E=E_F=0$ is negligible for all typical semiconductors such as GaAs, Si and Ge. Therefore, the spin injection, which is determined by current in the reverse direction through the Schottky barrier, is usually extremely small owing to relatively large barrier width l and barrier height $\Delta \gg k_B T$.

Figure 1A:
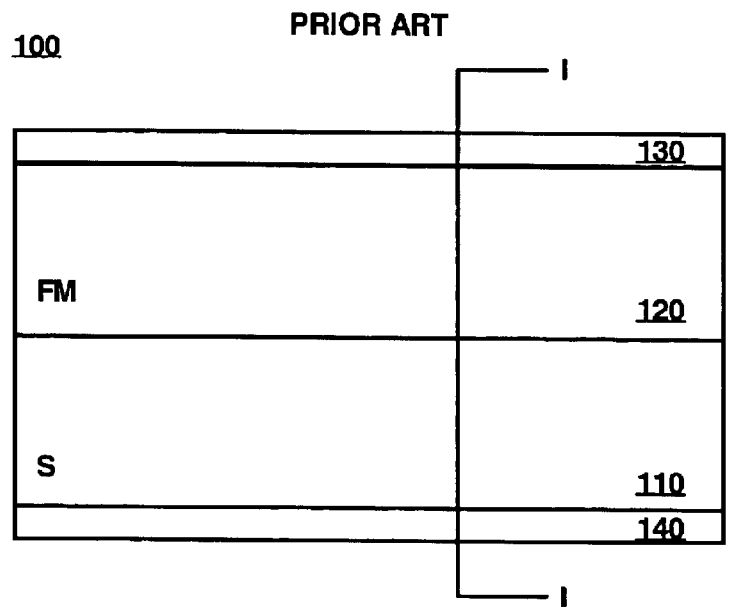
FIG. 1A illustrates a schematic of a conventional spin-injection device.
Figure 1B:
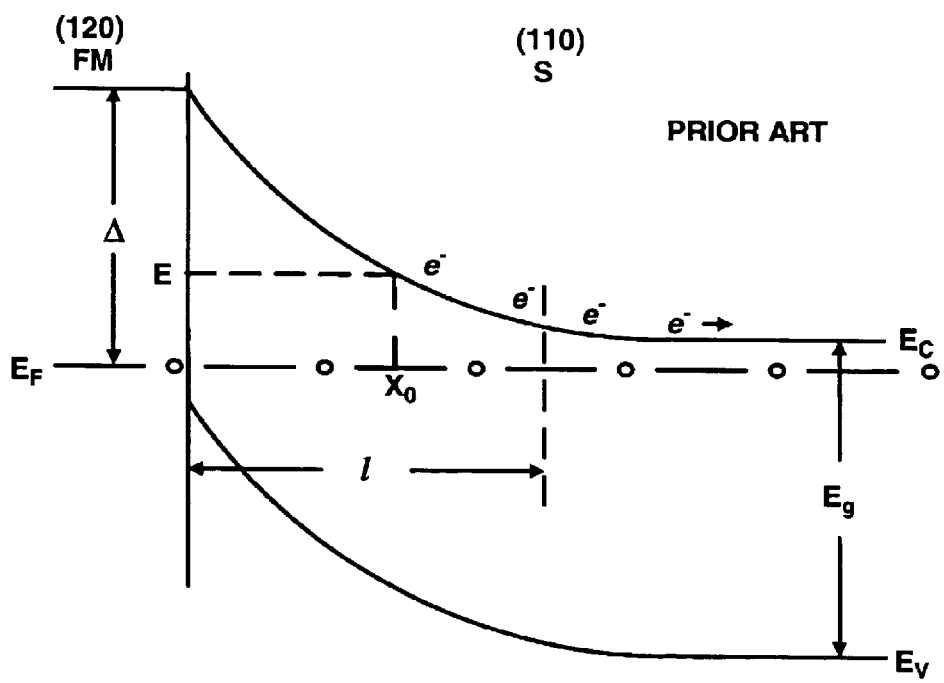
FIG. 1B illustrates an energy band diagram of the conventional spin-injection device illustrated in FIG. 1A along the line I—I.

Thus, effective spin injection in the conventional device 100 as shown in FIG. 1A is impossible. However, effective spin injection is possible at room temperature with the addition of a δ-doped layer 315 between the ferromagnetic layer 320 and the semiconductor 310, i.e., inside the ferromagnet-semiconductor junction as shown in FIG. 3A. In this instance, a strong screening of the junction potential occurs due to high donor concentration $N_d$ in the δ-doped layer 315 and the barrier width is decreased sharply. The tunneling transparency of the δ-doped layer 315 is close to unity, and therefore, the electrons can be easily injected from the ferromagnetic layer 320 into the semiconductor 310.

As shown in FIGS. 3B and 3C, the presence of the δ-doped layer 315 results in a barrier in the semiconductor 310 that is low and sufficiently wide, i.e., height $\Delta_0$ is relatively small and width $l_0$ is sufficiently large, which makes efficient spin polarized injection at room temperature possible. The energy $E=\Delta_0$ corresponds to a peak in density of minority d electrons in the ferromagnet (see FIGS. 2A and 2B).

It is preferred that the δ-doped layer 315 be formed to satisfy the following condition:

$$N_d l_+^2 \approx 2\frac{\varepsilon_0\varepsilon(\Delta-\Delta_0)}{q^2} \quad (4)$$

where $N_d$ and $l_+$ represent the donor concentration level and the thickness, respectively, of the δ-doped layer 315; $\varepsilon_0$ represents the permittivity of free space; ε represents a relative permittivity of the semiconductor 310; Δ represents a height of the Schottky barrier on the boundary of the ferromagnetic layer 320 and the δ-doped layer 315; $\Delta_0$ represents the height of the lower and wider potential barrier on the boundary of the δ-doped layer 315 and the semiconductor 310; and q represents elementary charge.

As noted above, when the barrier height $\Delta_0$ corresponds to the peak in the density of minority d↓ electrons in the ferromagnet (see FIGS. 2A and 2B), the electrons are almost 100% polarized. Also, it is preferred that the condition of Equation (4) is satisfied to the extent that a dispersion of $\Delta_0$ is substantially equal to the width of the peak in DOS shown in FIGS. 2A and 2B. Typically, this occurs if Equation (4) is accurate within 20 percent.

For a typical scenario where Δ=0.6 eV and $\Delta_0 \approx 0.1$ eV, Equation (4) may be satisfied if $l_+ \leq 1$ nm and $N_d$ ranges between $10^{20}$ cm$^{-3}$ and $10^{21}$ cm$^{-3}$. Under these conditions, as shown in FIG. 3B, the junction barrier includes an energy spike of value $\Delta-\Delta_0$ and thickness $l_+$ and also a semiconductor barrier of height $\Delta_0$ and width $l_0 \gg l_+$.

When the thickness $l_+$ of the δ-doped layer 315 is extremely small, electrons may easily tunnel through the energy spike. The following equation describes the limit on the thickness $l_+$:

$$l_+ \leq t_0 = \sqrt{\frac{\hbar^2}{2m^*(\Delta-\Delta_0)}} \quad (5)$$

For GaAs, $m^* \approx 0.07\, m_0$ where $m_0$ is the mass of free electron and to $t_0 \approx 1$ nm. For Si, the corresponding values are $\approx 0.2\, m_0$ and $\approx 0.5$ nm, respectively.

On the other hand, electrons with energies $E<\Delta_0$ cannot tunnel when:

$$l_0 \gg \sqrt{\frac{\hbar^2}{(2m^*\Delta_0)}} \quad (6)$$

The thermionic current over the wide barrier in the semiconductor 310 exceeds the tunneling current when $$\exp\left(-\frac{\Delta_0}{T}\right) \gg D(E \approx E_F = 0) \approx \exp\left[-\beta\sqrt{\frac{\Delta_0}{\hbar^2/2m^*l_0^2}}\right].$$

This condition may be written as:

$$l_0 > l_c = \frac{3}{4T}a_B\sqrt{\frac{\Delta_0 E_B m_0}{m^*}} \tag{7}$$

wherein $a_B = h^2/m_0 e^2$ and $E_B = m_0 e^4/h^2$ represent atomic parameters (with values 0.05 nm and 13.6 eV, respectively); and $m_0$ is the mass of free electron.

For instance, when $\Delta_0 \approx 0.1$ eV, T=300K (for GaAs, $l_c \approx 10$ nm, and for Si, $l_c \approx 5$ nm), the condition of equation (7) is satisfied when the donor concentration $N_s$ of the semiconductor 310 is such that $N_s < 3 \times 10^{18}$ cm$^3$. When this occurs, the injection current through the wide barrier within the semiconductor 310 is determined by thermionic emission of electrons with energies $E \geq \Delta_0$.

In addition, these hot electron states have very large difference between the density of spin-up and spin-down electrons. Therefore, large spin injection occurs at relatively high temperatures, including room temperature. It can be assumed that transparency $D \approx 0$ when $E < \Delta_0$, and that $D \approx 1$ when $E > \Delta_0$. Then, from equation (1), it follows that:

$$J_i \propto V \frac{e^2}{\hbar} g_i(\Delta_0) \exp(-\Delta_0/kT) \tag{8}$$

A degree of spin injection P is defined as:

$$P = \frac{|J_{d\downarrow} - J_{d\uparrow} + J_{s\downarrow} - J_{s\uparrow}|}{J_{d\downarrow} + J_{d\uparrow} + J_{s\downarrow} + J_{s\uparrow}} \approx \frac{|J_{d\downarrow} - J_{d\uparrow}|}{J_{d\downarrow} + J_{d\uparrow}} \tag{9}$$

and a coefficient of spin injection $\gamma$ may be defined as $$\gamma = \frac{|J_{d\downarrow} + J_{s\downarrow}|}{J_{d\downarrow} + J_{d\uparrow} + J_{s\downarrow} + J_{s\uparrow}}. \tag{10}$$

As an example, in Ni, Fe, and Co, the density of states for minority d-electrons, $g_{d\downarrow}$, has a spike near Fermi level, i.e. where $E \approx 0.1$ eV. This is shown in FIGS. 2A and 2B for Ni. At this energy level, $g_{d\downarrow}$ is much larger than $g_{d\uparrow}$, $g_{s\downarrow}$, and $g_{s\uparrow}$ (the density of states for the majority d-electrons and minority and majority s-electrons, respectively). For Ni in an energy range $E \approx 0.1 + 0.05$ eV, the values of the densities of states are: $g_{d\downarrow} \approx 6 \times 10^{22}$ (cm$^3$ eV)$^{-1}$, $g_{d\uparrow} \approx 0.04$ $g_{d\downarrow}$, $g_{s\downarrow} \approx g_{s\uparrow} \ll g_{d\downarrow}$. For Fe, a similar spike occurs at energy level $E \approx 0.1$ eV and $g_{d\downarrow} \gg g_{d\uparrow} \gg g_{s\downarrow} \approx g_{s\uparrow}$. In this instance, the degree and coefficient of spin injection may be described as:

$$P_s \approx \frac{g_{d\downarrow}(\Delta_0) - g_{d\uparrow}(\Delta_0)}{g_{d\downarrow}(\Delta_0) + g_{d\uparrow}(\Delta_0)} \text{ and} \tag{11}$$

$$\gamma_s \approx \frac{g_{d\downarrow}(\Delta_0)}{g_{d\downarrow}(\Delta_0) + g_{d\uparrow}(\Delta_0)} \tag{12}$$

Both $P_s$ and $\gamma_s$ are very close to 100% due to the large differences in the densities of states of the minority and majority spin electrons with energy E such that $E \approx \Delta_0$. This implies that the total current $J \approx J_{d\downarrow}$. The conductance G may be defined as:

$$G \approx G_{d\downarrow} = \frac{J_{d\downarrow}}{V} \propto \frac{e^2}{\hbar} g_{d\downarrow} \exp\left(-\frac{\Delta_0}{kT}\right) \tag{13}$$

Both the total current $J \approx J_{d\downarrow}$ and the conductance $G \approx G_{d\downarrow}$ are rather large owing to the small value of $\Delta_0/kT$. Also, this emitted current is practically 100% spin polarized.

As noted above, large spin injection may be realized in a heterostructure FM-n$^+$-n structure. The δ-doped layer 315 of the heterostructure FM-n$^+$-n may be formed by growing a heavily n$^+$ doped layer above the n-doped semiconductor 310. As shown in FIG. 3C, the δ-doped layer 315 thus formed has a narrower energy band gap $E_g^\delta$ than the energy band gap $E_g$ of the semiconductor 310, i.e. $E_g^\delta < E_g$. It is preferred that the electron affinity of the δ-doped layer 315 of the heterostructure is greater by a value close to $\Delta_0$ than the electron affinity of the semiconductor 310. In this case large amount of current may be spin injected, if the following conditions are satisfied:

$$l_+ \leq t_0 \tag{14}$$

$$N_d > 2\frac{\varepsilon_0 \varepsilon (\Delta - \Delta_0)}{q^2 l_+^2} \tag{15}$$

and $$N_s < 3 \times 10^{18} \text{ cm}^{-3} \tag{16}$$

Under these conditions the potential profile has proper shape, which is shown in FIG. 3C and ensures the efficient room-temperature spin injection from ferromagnetic layer 320 into the semiconductor 310.

Examples of heterostructures include FM-GaAs-Ga$_{1-x}$Al$_x$As (i.e. δ-doped layer 315 is formed from GaAs and the semiconductor 310 is formed from Ga$_{1-x}$Al$_x$As), FM-Ge$_x$Si$_{1-x}$—Si, FM-Zn$_{1-x}$Cd$_x$Se—ZnSe, FM-Ga$_{1-x}$In$_x$P—GaP, and FM-Ga$_{1-x}$In$_x$P$_{1-y}$As$_y$—Ga$_{1-z}$P, where x, 1-x, y, 1-y, z, and 1-z quantities refer to the relative composition of the respective materials. The relative compositions may be tailored to achieve particular desired characteristics. The barrier height $\Delta_0$, near the δ-doped layer 315 and the semiconductor 310 interface (e.g., GaAs—Ga$_{1-x}$Al$_x$As, Ge$_x$Si$_{1-x}$—Si, and FM-Zn$_{1-x}$Cd$_x$Se—ZnSe), is determined by the composition x, and may be tuned to values of interest in the range such as between 0.05 eV and 0.15 eV.

It has been shown that an efficient room-temperature spin injection from ferromagnets, such as Co, Fe, and Ni, films into semiconductors may be realized.

Figure 4A:
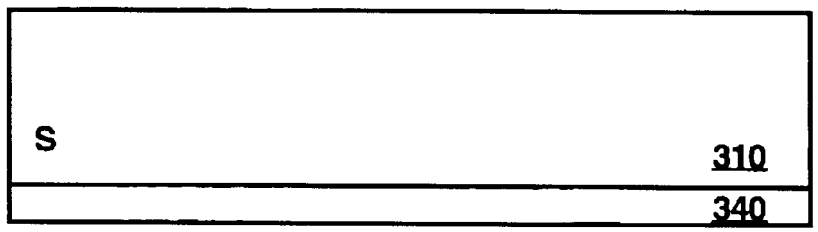
FIGS. 4A–4C illustrate an embodiment of a method to fabricate the spin-injection device of FIG. 3A.
Figure 4B:
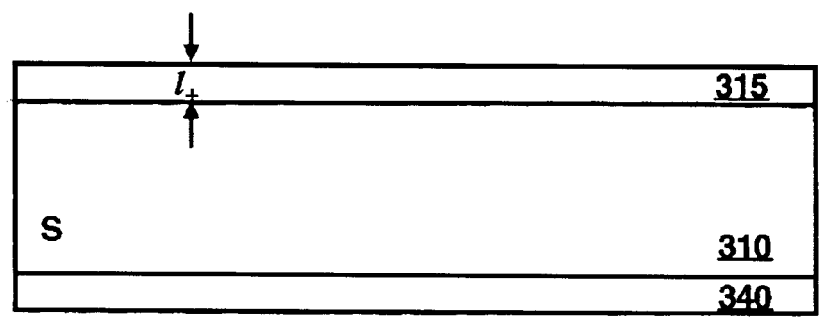
Figure 4C:
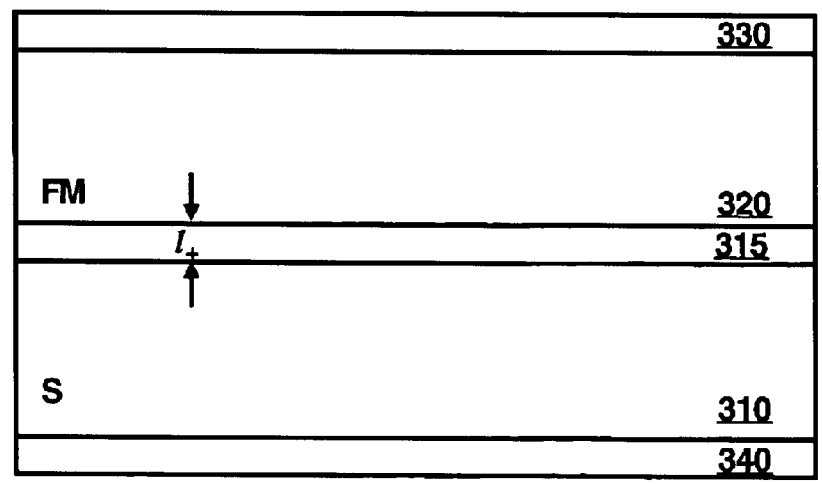

FIGS. 4A–4C illustrate an embodiment of a method to fabricate the spin-injection device of FIG. 3A. As shown in FIG. 4A, the electrode 340 may be formed and the semiconductor 310 may be formed to be in electrical contact with the electrode 340. Then as shown in FIG. 4B, the δ-doped layer 315 may be formed above the semiconductor 310. In one instance, the δ-doped layer 315 may be formed by heavily doping a portion of the semiconductor 310 with electron rich materials. In another instance, after forming the semiconductor 310, the δ-doped layer 315 may be formed by growing an extremely heavily n$^+$ doped very thin epitaxial layer. Then, as shown in FIG. 4C, the ferromagnetic layer 320 may be formed above the δ-doped layer 315 and the electrode 330 may be formed to be in electrical contact with the ferromagnetic layer 320.

Figure 5:
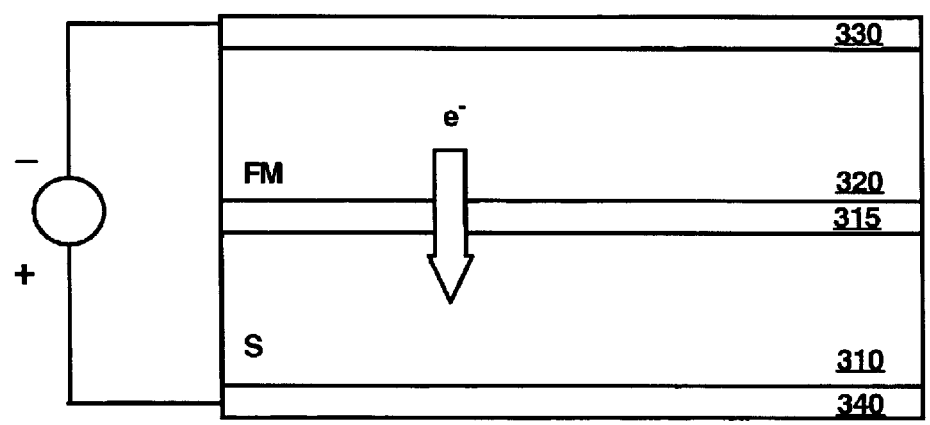
FIG. 5 shows the embodiment of the spin-injection device in operation.

To operate the spin-injection device 300, a bias voltage may be applied. As shown in FIG. 5, the bias voltage may be applied such that the semiconductor 310 is positive relative to the ferromagnetic layer 320, and thus spin-injecting electrons fly in the direction from the ferromagnetic layer 320 to the semiconductor 310.

What has been described and illustrated herein are preferred embodiments of the invention along with some of its variations. The terms, descriptions and figures used herein are set forth by way of illustration only and are not meant as limitations. Many variations are possible within the spirit and scope of the invention, which is intended to be defined by the following claims—and their equivalents—in which all terms are meant in their broadest reasonable sense unless otherwise indicated.

What is claimed is:

1. A spin-injection device, comprising:
   a semiconductor;
   a ferromagnetic layer formed above the semiconductor; and
   a δ-doped layer formed between the ferromagnetic layer and the semiconductor, wherein the δ-doped layer has a dopant concentration that is greater than or equal to $10^{20}$ cm$^{-3}$.

2. The device of claim 1, wherein the δ-doped layer and the semiconductor are negatively doped.

3. The device of claim 1, wherein the δ-doped layer is formed by growing n$^+$ doped layer above the semiconductor.

4. The device of claim 3, wherein an energy band gap of the δ-doped layer is narrower than an energy band gap of the semiconductor.

5. The device of claim 4, wherein:
   the δ-doped layer is formed from at least one of GaAs, Ge$_x$Si$_{1-x}$, Zn$_{1-x}$Cd$_x$Se, Ga$_{1-x}$In$_x$P, Ga$_{1-x}$In$_x$P$_{1-y}$As$_y$; and
   the semiconductor is formed from at least one of Ga$_{1-x}$Al$_x$As, Si, ZnSe, GaP, Ga$_{1-x}$In$_x$P.

6. The device of claim 1, wherein the ferromagnetic layer is formed from at least one of Ni, Fe, Co, and alloys therefrom.

7. The device of claim 1, wherein the semiconductor is formed from at least one of Si, GaAs, ZnTe, GaSb, GaP, Ge, InAs, CdSe, InP, InSb, CdTe, CdS, ZnS, ZnSe, AlP, AlAs, and AlSb, and compounds thereof.

8. The device of claim 1, further comprising:
   a first electrode formed to make electrical contact with the ferromagnetic layer; and
   a second electrode formed to make electrical contact with the semiconductor.

9. A method for forming a spin-injection device, comprising:
   forming a semiconductor;
   forming a ferromagnetic layer above the semiconductor; and
   forming a δ-doped layer between the ferromagnetic layer and the semiconductor, wherein forming the δ-doped layer comprises forming a layer having a dopant concentration that is greater than or equal to $10^{20}$ cm$^{-3}$.

10. The method of claim 9, wherein the semiconductor is n-doped and the step of forming the δ-doped layer includes heavily doping a portion of the semiconductor with electron rich donor impurities.

11. The method of claim 9, wherein the semiconductor is n-doped and the step of forming the δ-doped layer includes forming the δ-doped layer such that an energy band gap of the δ-doped layer is narrower than an energy band gap of the semiconductor.

12. The method of claim 11, wherein the forming of the δ-doped layer includes epitaxially growing a heavily doped n$^+$ layer above the semiconductor.

13. The method of claim 9, further comprising:
    forming a first electrode to make electrical contact with the ferromagnetic layer; and
    forming a second electrode formed to make electrical contact with the semiconductor.

14. A spin-injection device, comprising:
    a semiconductor that is negatively doped;
    a ferromagnetic layer formed above the semiconductor; and
    a δ-doped layer formed between the ferromagnetic layer and the semiconductor, wherein the δ-doped layer that is negatively doped and that satisfies a condition $$N_d l_+^2 \approx 2\frac{\varepsilon_0 \varepsilon (\Delta - \Delta_0)}{q^2},$$

wherein $l_+$ represents a thickness of the δ-doped layer, $N_d$ represents a donor concentration of the δ-doped layer, $\epsilon$ represents a relative permittivity of the semiconductor, $\epsilon_0$ represents a permittivity of vacuum, $\Delta$ represents a Schottky potential barrier height of the δ-doped layer at an interface between the ferromagnetic layer and the δ-doped layer, $\Delta_0$ represents a potential barrier height of the semiconductor at an interface between the δ-doped layer and the semiconductor, and q represents a positive elementary charge.

15. The device of claim 14, wherein $\Delta_0$ corresponds to a peak in a density of minority d electrons in the ferromagnetic layer, wherein a Fermi level $E_F$ of the ferromagnetic layer is chosen as origin such that $E_F$=0.

16. The device of claim 15, wherein the condition $$N_d l_+^2 \approx 2\frac{\varepsilon_0 \varepsilon (\Delta - \Delta_0)}{q^2}$$

is satisfied to an extent that a dispersion of $\Delta_0$ is substantially equal to a width of the peak in the density of states of minority d electrons of the ferromagnetic layer.

17. A spin-injection device, comprising:
    a semiconductor, wherein the semiconductor comprises Si;
    a ferromagnetic layer formed above the semiconductor: and a δ-doped layer formed between the ferromagnetic layer and the semiconductor, wherein the δ-doped layer is formed by heavily doping a portion of the semiconductor with electron rich donor impurities, and at least one of P, As, and Sb are used as the electron rich donor impurities.

18. A spin-injection device comprising:
    a semiconductor;
    a ferromagnetic layer formed above the semiconductor; and
    a δ-doped layer formed between the ferromagnetic layer and the semiconductor by growing n$^+$ doped layer above the semiconductor, wherein an energy band gap of the δ-doped layer is narrower than an energy band gap of the semiconductor and the δ-doped layer satisfies a condition $$N_d > 2\frac{\varepsilon_0 \varepsilon (\Delta - \Delta_0)}{q^2 l_+^2},$$

wherein $l_+$ represents a thickness of the δ-doped layer, $N_d$ represents a donor concentration of the δ-doped layer, $\epsilon$ represents a relative permittivity of the semiconductor, $\epsilon_0$ represents a permittivity of vacuum, $\Delta$ represents a Schottky potential barrier height of the $\delta$-doped layer at an interface between the ferromagnetic layer and the $\delta$-doped layer, $\Delta_0$ represents a potential barrier height of the semiconductor at an interface between the $\delta$-doped layer and the semiconductor, and q represents a positive elementary charge.

19. The device of claim 18, wherein:

$N_d$ substantially satisfies a condition $N_d \geq 10^{20}$ cm$^{-3}$; and
$l_+$ substantially satisfies a condition $l_+ \leq 1$ nm.

20. The device of claim 19, wherein a donor concentration $N_s$ of the semiconductor substantially satisfies a condition $N_s \leq 3 \times 10^{18}$ cm$^{-3}$.

21. The device of claim 18, wherein an electron affinity of the $\delta$-doped layer is greater than an electron affinity of the semiconductor by a value close to $\Delta_0$.

22. A method for forming a spin-injection device, comprising:

forming a semiconductor that is n-doped;

forming a ferromagnetic layer above the semiconductor; and forming a $\delta$-doped layer that is n-doped and between the ferromagnetic layer and the semiconductor, wherein the $\delta$-doped layer is formed by heavily doping a portion of the semiconductor with electron rich donor impurities and the $\delta$-doped layer satisfies a condition $$N_d l_+^2 \approx 2 \frac{\varepsilon_0 \varepsilon (\Delta - \Delta_0)}{q^2},$$

wherein $l_+$ represents a thickness of the $\delta$-doped layer, $N_d$ represents a donor concentration of the $\delta$-doped layer, $\varepsilon$ represents a relative permittivity of the semiconductor, $\varepsilon_0$ represents a permittivity of vacuum, $\Delta$ represents a Schottky potential barrier height of the $\delta$-doped layer at an interface between the ferromagnetic layer and the $\delta$-doped layer, $\Delta_0$ represents a potential barrier height of the semiconductor at an interface between the $\delta$-doped layer and the semiconductor, and q represents a positive elementary charge.

23. A method for spin-injecting current into a semiconductor, comprising:

providing a spin-injection device, wherein the spin-injection device comprises a ferromagnetic layer, the semiconductor, and a $\delta$-doped layer between the ferromagnetic layer and the semiconductor; and applying bias voltage between the ferromagnetic layer and the semiconductor, wherein
the $\delta$-doped layer satisfies a condition $$N_d > 2 \frac{\varepsilon_0 \varepsilon (\Delta - \Delta_0)}{q^2 l_+^2},$$

wherein $l_+$ represents a thickness of the $\delta$-doped layer, $N_d$ represents a donor concentration of the $\delta$-doped layer, $\varepsilon$ represents a relative permittivity of the semiconductor, $\varepsilon_0$ represents a permittivity of vacuum, $\Delta$ represents a Schottky potential barrier height of the $\delta$-doped layer at an interface between the ferromagnetic layer and the $\delta$-doped layer, $\Delta_0$ represents a potential barrier height of the semiconductor at an interface between the $\delta$-doped layer and the semiconductor, and q represents a positive elementary charge.

24. A method for spin-injecting current into a semiconductor, comprising:

providing a spin-injection device, wherein the spin-injection device comprises a ferromagnetic layer, the semiconductor, and a $\delta$-doped layer between the ferromagnetic layer and the semiconductor, wherein the $\delta$-doped layer has a dopant concentration that is greater than or equal to $10^{20}$ cm$^{-3}$; and applying bias voltage between the ferromagnetic layer and the semiconductor.

25. The method of claim 24, wherein the bias voltage is such that a potential on the semiconductor is positive relative to a potential on the ferromagnetic layer.

26. A method for forming a spin-injection device, comprising:

forming a semiconductor;

forming a ferromagnetic layer above the semiconductor; and forming a $\delta$-doped layer between the ferromagnetic layer and the semiconductor, wherein forming the $\delta$-doped layer comprises forming the $\delta$-doped layer to satisfy a condition $$N_d > 2 \frac{\varepsilon_0 \varepsilon (\Delta - \Delta_0)}{q^2 l_+^2},$$

wherein $l_+$ represents a thickness of the $\delta$-doped layer, $N_d$ represents a donor concentration of the $\delta$-doped layer, $\varepsilon$ represents a relative permittivity of the semiconductor, $\varepsilon_0$ represents a permittivity of vacuum, $\Delta$ represents a Schottky potential barrier height of the $\delta$-doped layer at an interface between the ferromagnetic layer and the $\delta$-doped layer, $\Delta_0$ represents a potential barrier height of the semiconductor at an interface between the $\delta$-doped layer and the semiconductor, and q represents a positive elementary charge.

27. A spin-injection device, comprising:

a semiconductor, wherein the semiconductor comprises GaAs;

a ferromagnetic layer formed above the semiconductor; and a $\delta$-doped layer formed between the ferromagnetic layer and the semiconductor, wherein the $\delta$-doped layer is formed by heavily doping a portion of the semiconductor with electron rich donor impurities, and at least one of Ge, Se, Te, Si, Pb and Sn are used as the electron rich donor impurities.

* * * * *